US007071772B2

United States Patent
Cho

(10) Patent No.: US 7,071,772 B2
(45) Date of Patent: Jul. 4, 2006

(54) DIFFERENTIAL AMPLIFIER

(75) Inventor: Seong-Ik Cho, Kyoungki-do (KR)

(73) Assignee: Hynix Semiconductor Inc., Ichon-shi (KR)

( * ) Notice: Subject to any disclaimer, the term of this patent is extended or adjusted under 35 U.S.C. 154(b) by 40 days.

(21) Appl. No.: 11/019,670

(22) Filed: Dec. 23, 2004

(65) Prior Publication Data

US 2005/0156667 A1    Jul. 21, 2005

(30) Foreign Application Priority Data

Jan. 10, 2004    (JP)    ............... 10-2004-0001822

(51) Int. Cl.
*G06G 7/26*    (2006.01)
(52) U.S. Cl. ............... 327/563; 327/67; 327/89; 330/253; 330/260
(58) Field of Classification Search ............... 327/65, 327/67, 89, 563; 330/260
See application file for complete search history.

(56) References Cited

U.S. PATENT DOCUMENTS

| 5,013,943 A | 5/1991 | Hirose ............... 327/51 |
| 5,065,367 A | 11/1991 | Kondou ............... 365/208 |
| RE34,060 E | 9/1992 | Tanimura et al. ............ 365/208 |
| 5,237,533 A | 8/1993 | Papaliolios ............... 365/207 |
| 6,219,278 B1 | 4/2001 | Smith et al. ............ 365/185.21 |
| 6,750,684 B1 * | 6/2004 | Lim ............... 327/108 |
| 6,930,550 B1 * | 8/2005 | Wu ............... 330/261 |

FOREIGN PATENT DOCUMENTS

| JP | 06-282991 | 10/1994 |
| JP | 07-141874 | 6/1995 |
| JP | 11-306777 | 11/1999 |

* cited by examiner

*Primary Examiner*—Kenneth B. Wells
(74) *Attorney, Agent, or Firm*—Mayer, Brown, Rowe & Maw LLP

(57) ABSTRACT

There is provided a differential amplifier including: an output terminal through which an output voltage is outputted in response to an input voltage; a first inverter-type input unit connected between a first node and a second node to receive the input voltage; a second inverter-type input unit connected between a third node and a fourth node and receiving a reference voltage and having an output node connected to the output terminal; a circuit biased by an output of the first input unit and configuring a negative feedback loop together with the first input unit; an amplifying unit biased by the output of the first input unit to amplify the output of the first input unit; and a switching unit connected between the first node and the third node and between the second node and the fourth node in response to a voltage level of the output terminal.

6 Claims, 2 Drawing Sheets

DIFFERENTIAL AMPLIFIER

FIELD OF INVENTION

The present invention relates to a differential amplifier; and, more particularly, to a differential amplifier having a high gain at a wide frequency bandwidth.

DESCRIPTION OF PRIOR ART

In general, a dynamic random access memory (DRAM) uses a differential amplifier so as to compare voltage difference. The differential amplifier amplifies voltage difference between two input terminals, and voltages commonly inputted to two terminals do not influence an output.

Accordingly, if one pair of signal lines having the same electric environment is used as the input of the differential amplifier, an electric noise commonly induced to the signal lines does not influence the output at all and only the differential signals can be amplified.

FIG. 1 is a circuit diagram of a conventional MOS-type differential amplifier.

Referring to FIG. 1, the differential amplifier includes a current source $I_S$ disposed between a node N3 and a ground terminal VSS to supply a current, an NMOS transistor MN1 having a source-drain path between a node N1 and the node N3 and having a gate receiving an input voltage Vin, a PMOS transistor PM1 controlled by a voltage of the node N1 and configuring a negative feedback loop together with the NMOS transistor NM1, an NMOS transistor NM2 having a drain-source path between a node N2 and the node N3 and having a gate receiving a reference voltage Vref, and a PMOS transistor PM2 controlled by a voltage of the node N1 and outputting an output voltage together with the NMOS transistor NM2.

In an operation of the differential amplifier shown in FIG. 1, if the reference voltage Vref is higher than the input voltage Vin, a current flowing through the NMOS transistor is larger than a current flowing through the NMOS transistor NM1, such that the output voltage Vout of the node N2 becomes a logic low level. On the contrary, if the reference voltage Vref is smaller than the input voltage Vin, a current flowing through the NMOS transistor NM1 is larger than a current flowing through the NMOS transistor NM2, such that an output voltage Vout of the node N2 becomes a logic high level.

Meanwhile, in the case of the conventional differential amplifier, a voltage must be applied to a MOS resistor in order for the symmetry of the output voltage Vout. Also, the current source for supplying the current is required and an additional gain terminal is required so as to amplify the gain.

Further, with the tendency of high frequency in all devices, the circuits required by the devices also require the improved frequency characteristic.

However, if the gain increases, there occurs a problem in that the frequency characteristic is degraded.

SUMMARY OF INVENTION

It is, therefore, an object of the present invention to provide a differential amplifier capable of increasing a gain without any limit of a frequency characteristic and generating a symmetrical output voltages without any bias current circuit.

In accordance with an aspect of the present invention, there is provided a differential amplifier including: an output terminal through which an output voltage is outputted in response to an input voltage; a first inverter-type input unit connected between a first node and a second node to receive the input voltage; a second inverter-type input unit connected between a third node and a fourth node and receiving a reference voltage and having an output node connected to the output terminal; a circuit biased by an output of the first input unit and configuring a negative feedback loop together with the first input unit; an amplifying unit biased by the output of the first input unit to amplify the output of the first input unit; and a switching unit connected between the first node and the third node and between the second node and the fourth node in response to a voltage level of the output terminal.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a semiconductor memory device in accordance with the present invention will be described in detail referring to the accompanying drawings.

Figure 1:
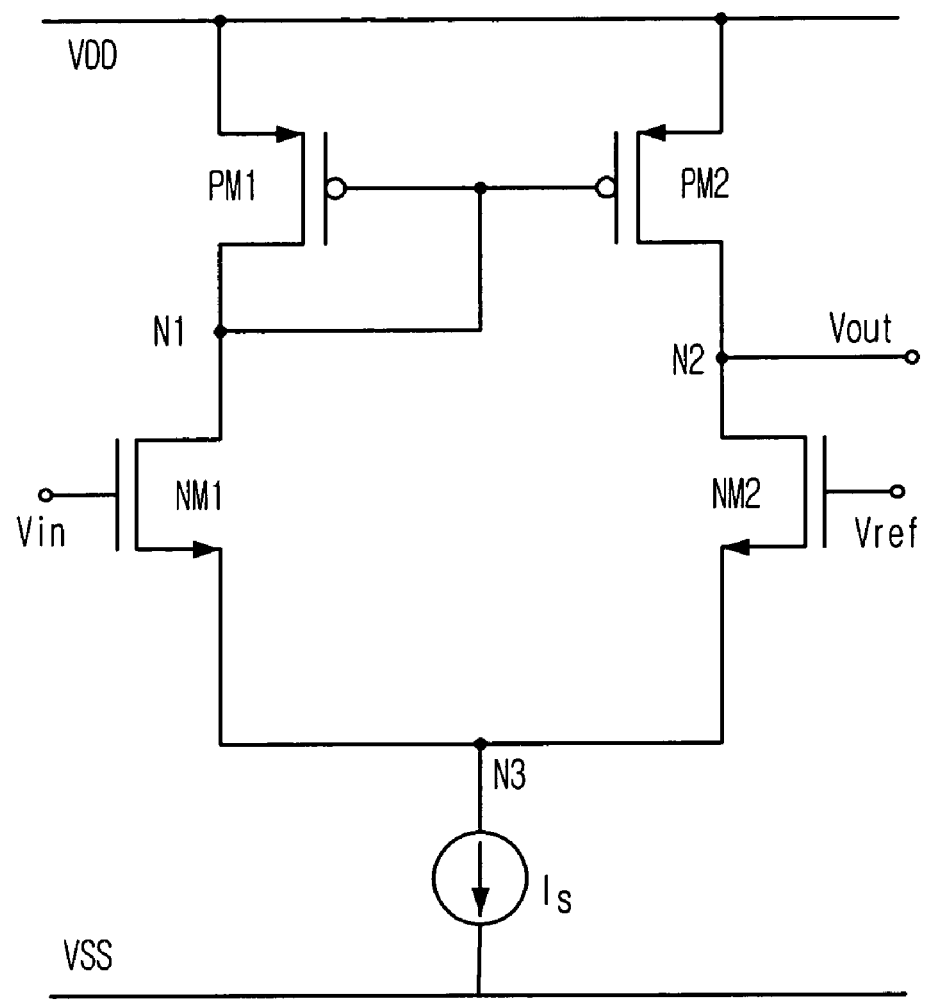
FIG. 1 is a circuit diagram of a conventional differential amplifier.
Figure 2:
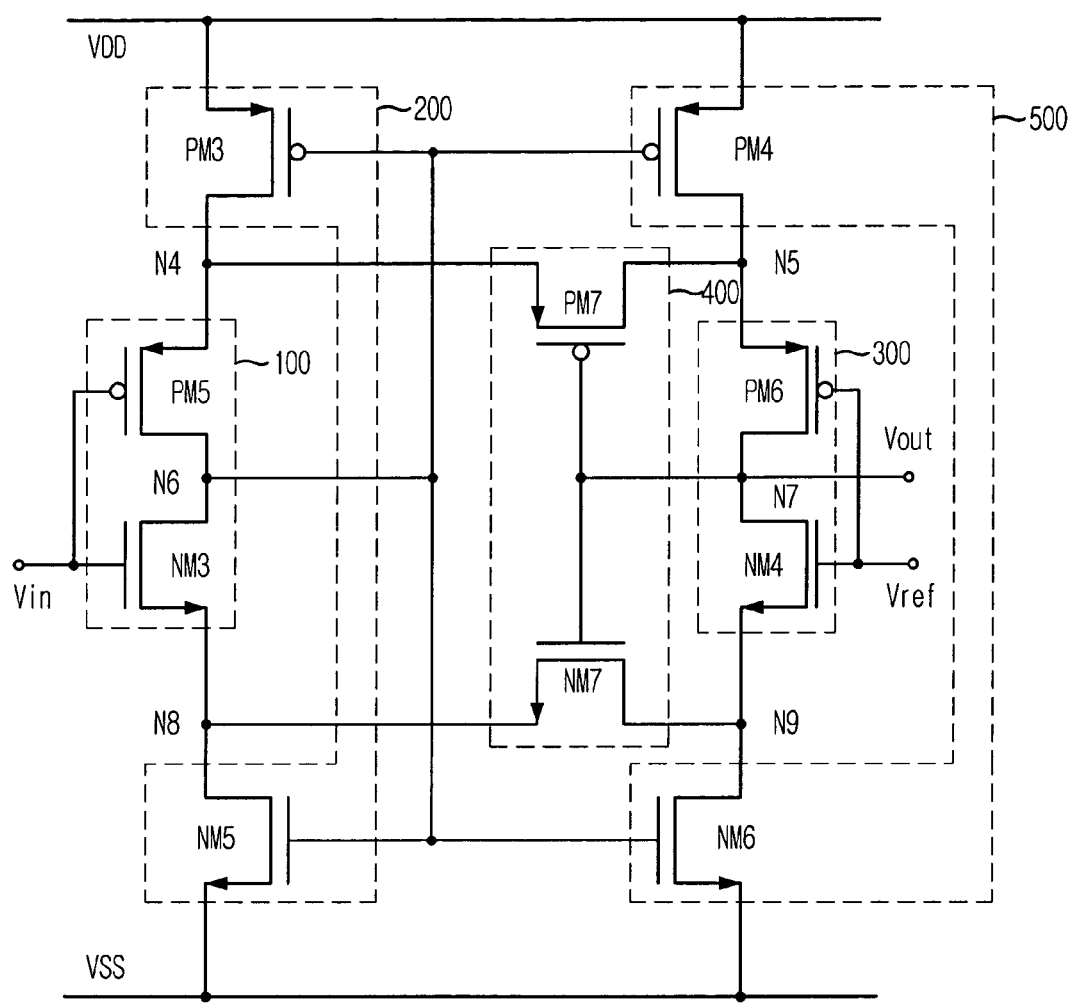
FIG. 2 is a circuit diagram of a differential amplifier in accordance with the present invention.

FIG. 2 is a circuit diagram of a differential amplifier in accordance with the present invention.

Referring to FIG. 2, the differential amplifier in accordance with the present invention includes an output terminal N7 through which an output voltage Vout is outputted in response to an input voltage Vin, an inverter-type left input unit 100 connected between a node N4 and a node N8 and receiving the input voltage Vin, an inverter-type right input unit 300 connected between a node N5 and a node N9 and receiving a reference voltage Vref, an output node of the inverter-type right input unit 300 being connected to an output node N7, MOS transistors PM3 and NM5 biased by an output of the left input unit 100 to configure a negative feedback loop together with the left input unit 100, an amplifying unit 500 biased by the output of the left input unit 100 to amplify the output of the left input unit 100, and a switching unit 400 connected between the node N4 and the node N5 and between the node N8 and the node N9 in response to a voltage level of the output terminal N7.

In more detail, the left input unit 100 includes a PMOS transistor PM5 and an NMOS transistor NM3. The PMOS transistor PM5 has a gate receiving the input voltage Vin, a source connected to the node N4, and a drain connected to an output node N6 of the left input unit 100. The NMOS transistor NM3 has a gate receiving the input voltage Vin, a source connected to the node N8, and a drain connected to the output node N6 of the left input unit 100. The right input unit 300 includes a PMOS transistor PM6 and an NMOS transistor NM4. The PMOS transistor PM6 has a gate receiving the reference voltage Vref, a source connected to the output node N5, and a drain connected to the node N7. The NMOS transistor NM4 has a gate receiving the reference voltage Vref, a source connected to the node N9, and a drain connected to the output node N7.

In the negative feedback loop, the PMOS transistor PM3 has a gate connected to the output node N6 of the left input unit 100 and a source-drain path connected between a power supply terminal VDD and the node N4, and the NMOS transistor NM5 has a gate connected to the output node N6 of the left input unit 100 and a source-drain path connected between a ground terminal VSS and the node N8.

The amplifying unit 500 includes a PMOS transistor PM4 and an NMOS transistor NM6. The PMOS transistor PM4 has a gate connected to the output node of the left input unit 100 and a source-drain path connected between the power supply terminal VDD and the node N5, and the NMOS transistor NM6 has a gate connected to the output node N6 of the left input unit 100 and a source-drain path connected between the ground terminal VSS and the node N9.

The switching unit includes a PMOS transistor PM7 and an NMOS transistor NM7. The PMOS transistor PM7 has gate connected to the output node N7 and a source-drain path connected between the node N4 and the node N5, and the NMOS transistor NM7 has a gate connected to the node N7 and a source-drain path connected to the node N8 and the node N9.

Unlike the prior art, the differential amplifier in accordance with the present invention includes the NMOS transistors NM5 and NM6 and the PMOS transistors PM3 and PM4, which are controlled by the voltage of the node N6, in order to eliminate the current source for supplying the current. In addition, the input voltage Vin is received through the inverter-type input units 100 and 300 to thereby increase the gain, and the circuit is configured to be symmetrical to an X axis such that a level shifter for swing the output voltage at VDD/2 is required.

Accordingly, the frequency bandwidth increases two times, so the differential amplifier of the present invention is adapted for high speed application. Further, the current source is not required and the standby current is small, such that the differential amplifier has low power consumption.

An operation of the differential amplifier will be described below.

First, in case where the input voltage Vin is larger than the reference voltage Vref, the nodes N4 and N5 are disconnected by the PMOS transistor PM7 of the switching unit 400 and the nodes N8 and N9 are connected by the NMOS transistor NM7. The voltage of the node N4 swings the input voltage between a voltage of VDD−VSS and a minimum voltage of the PMOS transistor PM3 by the negative feedback of the PMOS transistor PM3, and the voltage of the node N5 swings up to the VDD level by the common source amplifier of the PMOS transistor PM4. Since the nodes N8 and N9 are connected together by the NMOS transistor NM7 to thereby form the negative feedback loop, the nodes N8 and N9 have the same voltage level and the input voltage swings between the voltage of VSS+VDD and the minimum voltage of the NMOS transistors NM5 and NM6. In addition, in case where the input voltage Vin is smaller than the reference voltage Vref, the differential amplifier has an opposite characteristic and can be construed in the same manner.

Since the sources of the PMOS transistor PM6 and the NMOS transistor NM4 of the right input unit 300 swing between the power supply voltage VDD and the ground voltage VSS, the output voltage Vout swings between the power supply voltage VDD and the ground voltage VSS, such that the present invention is adapted for high speed application.

As described above, the differential amplifier in accordance with the present invention has two times gain and two times frequency bandwidth and has a small standby current. Further, a level shifter is not required at the output terminal.

The present application contains subject matter related to Korean patent application No. 2004-1822, filed in the Korean Patent Office on Jan. 10, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A differential amplifier comprising:
a first input means connected between a first node and a second node to receive an input voltage;
a second input means connected between a third node and a fourth node, the second input means receiving a reference voltage and having an output node connected to an output terminal for outputting an output voltage in response to the input voltage;
a means for configuring a negative feedback loop together with the first means and for being biased by an output of the first input means and;
an amplifying means biased by the output of the first input means to amplify the output of the first input means; and
a switching means connected between the first node and the third node and between the second node and the fourth node for switching in response to a voltage level of the output terminal.

2. The differential amplifier as recited in claim 1, wherein the first input means includes:
a first PMOS transistor having a gate receiving the input voltage, a source connected to the first node, and a drain connected to an output node of the first input means; and
a first NMOS transistor having a gate receiving the input voltage, a source connected to the second node, and a drain connected to the output node of the first input means.

3. The differential amplifier as recited in claim 2, wherein the second input means includes:
a second PMOS transistor having a gate receiving the reference voltage, a source connected to the third node, and a drain connected to an output node of the second input means; and
a second NMOS transistor having a gate receiving the reference voltage, a source connected to the fourth node, and a drain connected to the output node of the second input means.

4. The differential amplifier as recited in claim 3, wherein the means for configuring the negative feedback loop includes:
a third PMOS transistor having a gate connected to the output node of the first input means and a path source-drain connected between a power supply terminal and the first node; and
a third NMOS transistor having a gate connected to the output node of the first input means and a source-drain path connected between a ground terminal and the second node.

5. The differential amplifier as recited in claim 4, wherein the amplifying means includes:
  a fourth PMOS transistor having a gate connected to the output node of the first input means and a source-drain path connected between the power supply terminal and the third node; and
  a fourth NMOS transistor having a gate connected to the output node of the first input means and a source-drain path connected between the ground terminal and the fourth node.

6. The differential amplifier as recited in claim 1, wherein the switching means includes:
  a fifth PMOS transistor having a gate connected to the output terminal and a source-drain path connected between the first node and the third node; and
  a fifth NMOS transistor having a gate connected to the output terminal and a source-drain path connected between the second node and the fourth node.

* * * * *